(12) United States Patent
Koizumi

(10) Patent No.: US 7,005,747 B2
(45) Date of Patent: Feb. 28, 2006

(54) SEMICONDUCTOR DEVICE HAVING ADDITIONAL FUNCTIONAL ELEMENT AND METHOD OF MANUFACTURING THEREOF

(75) Inventor: Naoyuki Koizumi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 64 days.

(21) Appl. No.: 10/673,401

(22) Filed: Sep. 30, 2003

(65) Prior Publication Data
US 2004/0067605 A1 Apr. 8, 2004

(30) Foreign Application Priority Data
Oct. 2, 2002 (JP) ............... 2002-290274

(51) Int. Cl.
*H01L 29/40* (2006.01)
(52) U.S. Cl. .............. 257/777; 257/787; 257/790; 257/795
(58) Field of Classification Search .......... 257/686, 257/777, 778–784, 787–790, 795, 499, 501, 257/503, 665–669, 672–678, 687, 690–693, 257/698, 700–703, 712, 729, 734–738, 772–774
See application file for complete search history.

(56) References Cited

U.S. PATENT DOCUMENTS

| | | | | |
|---|---|---|---|---|
| 4,143,385 | A * | 3/1979 | Miyoshi et al. ........... | 257/82 |
| 6,181,008 | B1 * | 1/2001 | Avery et al. ............. | 257/723 |
| 6,272,020 | B1 * | 8/2001 | Tosaki et al. ............ | 361/763 |
| 6,369,448 | B1 * | 4/2002 | McCormick ............ | 257/777 |
| 6,489,686 | B1 * | 12/2002 | Farooq et al. .......... | 257/777 |
| 6,659,512 | B1 * | 12/2003 | Harper et al. ........... | 257/777 |
| 6,713,860 | B1 * | 3/2004 | Li ........................ | 257/700 |
| 6,841,842 | B1 * | 1/2005 | Li ........................ | 257/459 |
| 6,844,619 | B1 * | 1/2005 | Tago ..................... | 257/686 |
| 2004/0145051 | A1 * | 7/2004 | Klein et al. ............ | 257/734 |

FOREIGN PATENT DOCUMENTS

| | | |
|---|---|---|
| JP | 8-148595 | 6/1996 |
| JP | 9-199374 | 7/1997 |
| JP | 10-209323 | 8/1998 |

* cited by examiner

*Primary Examiner*—Michael Lebentritt
*Assistant Examiner*—Andre' Stevenson
(74) *Attorney, Agent, or Firm*—Staas & Halsey LLP

(57) ABSTRACT

A capacitor is arranged at the closest position to a semiconductor element and the generation of switching noise is reduced as low as possible by increasing the processing speed, arranging the components highly intensively and reducing the operation voltage. One face of the capacitor is connected to an electrode of the electrode forming face of the semiconductor element and the other face of the capacitor is connected to the connection pads on the wiring board so that the capacitor is interposed between the electrode forming face of the semiconductor element and the semiconductor mounting face of the wiring board, the other face of the capacitor is connected to the connection pads on the wiring board, and at the same time, flip-chip connection is conducted on the connection pads on the wiring board via the solder bumps connected to the electrodes of the semiconductor element.

4 Claims, 3 Drawing Sheets

SEMICONDUCTOR DEVICE HAVING ADDITIONAL FUNCTIONAL ELEMENT AND METHOD OF MANUFACTURING THEREOF

BACKGROUND OF THE INVENTION

1. Field of the Invention

The present invention relates to a semiconductor device into which a passive element or an active element, to exhibit a specific electric functional such as a capacitor, resistor, inductance or the like, which will be referred to as an "additional functional element" hereinafter, is incorporated. The present invention also relates to a method of manufacturing such a semiconductor device.

2. Description of the Related Art

In the case of a semiconductor device such as MPU (micro processing unit), CPU (central processing unit) or the like having a large number of transistors, in which the electric power sources of these transistors are simultaneously switched, that is, these transistors are simultaneously turned on and off, a high intensity of electric current flows between the electric power source and the ground when the transistors are switched. Therefore, voltage fluctuates, that is, what is called "simultaneous switching noise" is generated. In order to reduce the noise, it is conventional to take countermeasures in which a decoupling capacitor is mounted outside the semiconductor element.

Further, it is conventional that a capacitor is mounted on a package or a wiring board on which the semiconductor element is mounted. However, there is a demand for increasing the processing speed, arranging the components highly intensively and reducing the voltage. In response to this demand, it has become a serious problem to take countermeasures to reduce the switching noise. Therefore, it has been conventionally tried to incorporate a capacitor into the package closer to the semiconductor element. However, when the capacitor is incorporated into the package closer to the semiconductor element, the package manufacturing process becomes complicated and the manufacturing cost is inevitably raised.

In the semiconductor device disclosed in Japanese Unexamined Patent Publication No. 8-148595 (JP'595), a chip carrier is formed on an alumina ceramic substrate, and a decoupling capacitor made of high dielectric material is formed in the chip carrier, and a large-scale integrated circuit (LSI) chip is mounted on the chip carrier.

In the semiconductor device disclosed in this Patent Publication (JP'595), a decoupling capacitor is formed in a chip carrier. However, in this structure, a semiconductor element, that is, an LSI chip is not directly mounted on an alumina ceramic material which is a package. Therefore, a conventionally used package cannot be used as it is.

Japanese Unexamined Patent Publication No. 9-199374 (JP'374) discloses a thin film condenser, a package, used for a semiconductor device, on which the thin film condenser is mounted, and a semiconductor device. That is, in order to make the handling easy so that mounting can be easily performed, and further in order to effectively reduce the noise generated from the electric power source system, a thin film condenser made of a highly dielectric film is formed in a semiconductor package. According to the constitution shown in FIG. 15 of this Patent Publication (JP'374), a thin film condenser is connected to a semiconductor chip, and this semiconductor chip is mounted on a package body.

According to this Patent Publication (JP'374), a thin film condenser made of a highly dielectric film is formed in a semiconductor package. However, only one face of the thin film condenser is connected to the semiconductor element, and the other face of the thin film condenser is not connected to the package. Therefore, a region of the package cannot be effectively used.

Further, in Japanese Unexamined Patent Publication No. 10-209323 (JP'323), there is disclosed a semiconductor device in which a plurality of leads are arranged in the periphery of a printed wiring board and solder balls are arranged on a lower face of the printed wiring board as a plurality of contacts to electrically connect a circuit, which is formed on an upper face of the semiconductor chip, to pads, bonding wires, printing wires and electrodes. In this Patent Publication (JP'323), there is also disclosed a structure in which a small passive element is arranged in the periphery of a gap between the substrates.

According to this Patent Publication (JP'323), a plurality of small passive elements are arranged in the periphery between semiconductor substrates or between a printed wiring board and a mother board. However, each passive element is connected to only one electrode between both substrates. Although clearance between both the substrates can be ensured, a sufficiently effective countermeasure can not be taken for reducing switching noise.

SUMMARY OF THE INVENTION

It is an object of the present invention to provide a semiconductor device having an additional functional element characterized in that: the conventional semiconductor package can be used as it is; an additional functional element, such as a capacitor, can be arranged at the closest position to a semiconductor element; and an intensity of switching noise can be reduced to as low as possible under the conditions of increasing the processing speed, arranging the components highly intensively and reducing the operation voltage.

Further, it is another object of the present invention to provide a method of manufacturing the semiconductor device having an additional functional element.

In order to accomplish the above objects, the present invention provides a semiconductor device having an additional function comprising: a semiconductor element, at least on one face of which first and second electrodes are arranged; a wiring board having first and second connection pads on a face on which the semiconductor element is mounted; connection means for electrically connecting the first electrode with the first connection pad so that a small gap can be formed between the one face of the semiconductor element and the mounting face of the wiring board when the one face of the semiconductor element is arranged being directed toward the mounting face of the wiring board; and an element having a specific additional function arranged in the gap formed between a region of the second electrode of the semiconductor element and a region of the second connection pad of the wiring board, wherein the additional functional element is connected with the second electrode on the one face thereof and also connected with the second connection pad on the other face thereof so that a specific electric function can be exhibited.

The connection means is a solder bump, one face of the additional functional element is connected with the second electrode by means of ultrasonic connection, anisotropic conductive adhesive film or anisotropic conductive adhesive paste, and the other face of the additional functional element is connected with the connection pad by means of soldering.

A plurality of electrodes for signal use, which are used as the first electrodes, are arranged in an outer peripheral region on one face of the semiconductor element, electrodes for electric power supply and for grounding, which are used as third and fourth electrodes, are arranged in a central region other than the second electrode, the additional functional element is arranged in the gap defined between the central region of the semiconductor element and the wiring board, and the third and the fourth electrodes are electrically connected with third and fourth connection pads on the wiring board through a plurality of conductive vias penetrating from one face of the additional functional element to the other face thereof.

The additional functional element is an extremely thin type passive element or active element, or alternatively the additional functional element is an extremely thin type capacitor, resistor or inductance.

The present invention provides a method of manufacturing a semiconductor device having an additional functional element, said method comprising the following steps of: mounting an additional functional element on a semiconductor element having first and second electrodes at least on one face thereof, so that one face of the additional functional element can be connected with a second electrode of the semiconductor element and mounting the semiconductor element on a wiring board having first and second connection pads on the semiconductor mounting face thereof, so that the other face of the additional functional element is connected with the second connection pad of the wiring board, and simultaneously connecting the first electrode of the semiconductor element with the first connection pad via a connection means so that the additional functional element is interposed between the one face of the semiconductor element connected with the additional functional element and the mounting face of the wiring board.

BRIEF DESCRIPTION OF THE DRAWINGS

FIG. 2 is a sectional view showing a state in which a semiconductor element is connected on a package (or wiring board) under the condition that the capacitor 30 is built in.

DETAILED DESCRIPTION OF THE PREFERRED EMBODIMENTS

Referring to the accompanying drawings, an embodiment of the present invention will be explained in detail as follows.

Figure 1:
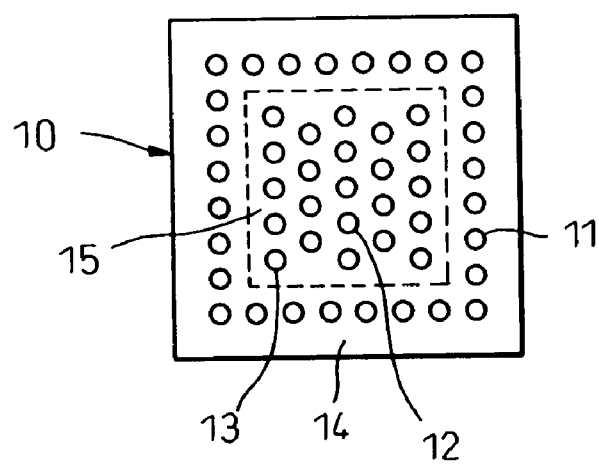
FIG. 1 is a plan view showing an electrode forming side of a semiconductor element suitably used for a semiconductor device of the present invention.
Figure 2:
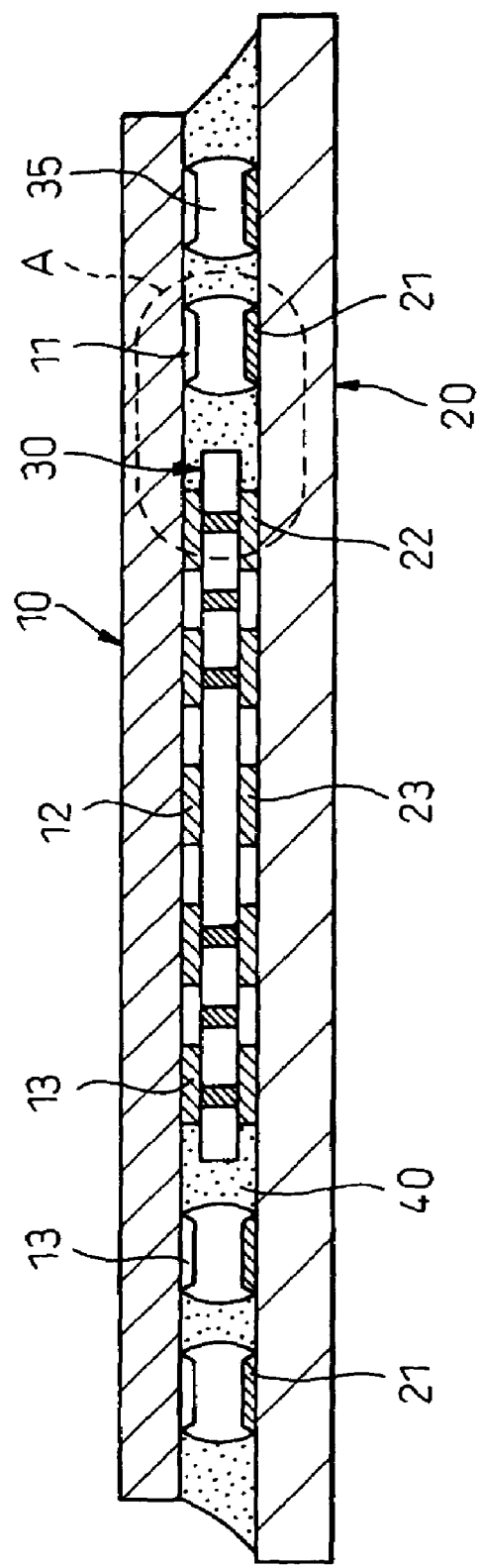
Figure 3:
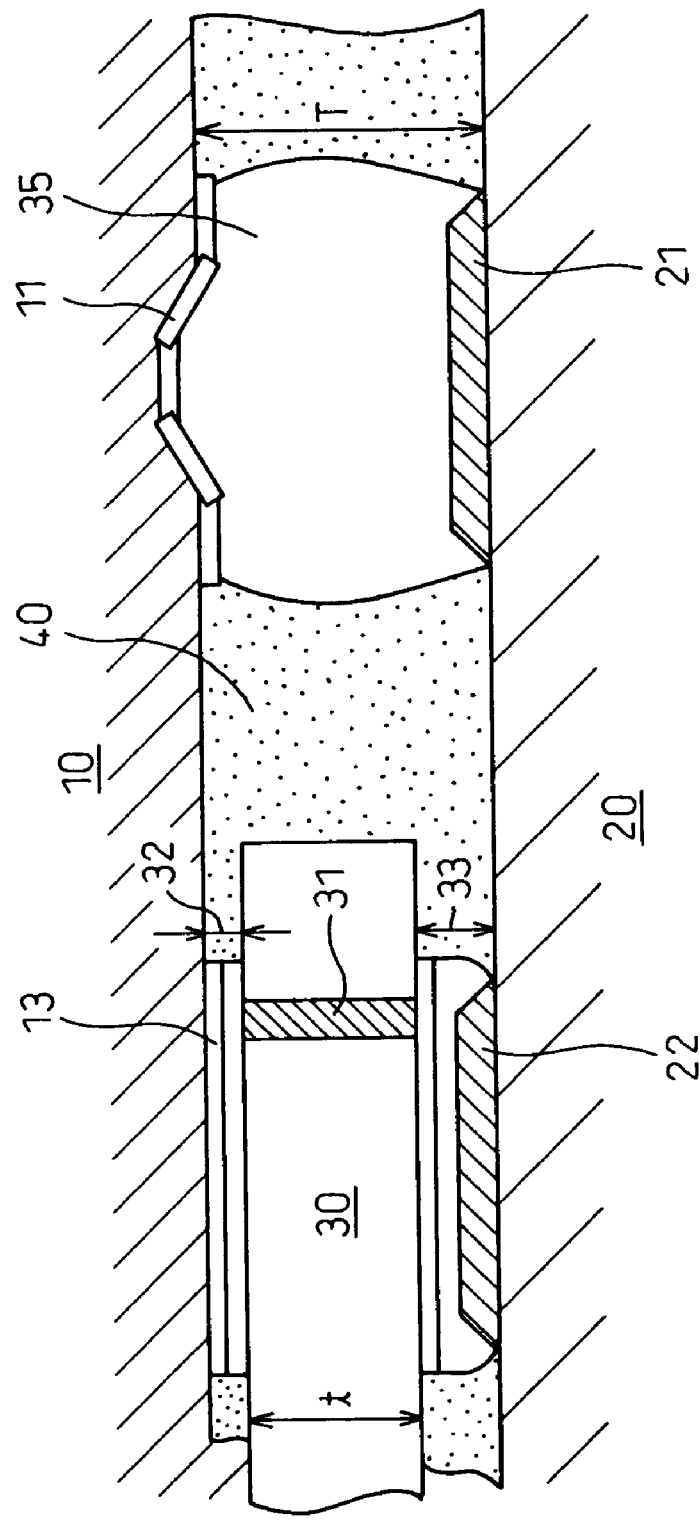
FIG. 3 is an enlarged sectional view showing portion A of FIG. 2.

The semiconductor element or the chip 10 is of the area array type which is mounted by means of flip-chip mounting. Usually, as shown in FIG. 1, a large number of electrodes 11, 12, 13 are arranged like an array on the side on which the electrodes are formed. In the outer peripheral region 14 of the substantially square electrode forming face, the electrodes (the first electrodes) 11 for signal use are arranged. In the inner region of the outer peripheral region or in the central region 15, the electrodes (the second electrodes) 12, which are connected with an upper face of the capacitor 30 of an extremely thin type additional functional element described later, are arranged, and the electrodes (the third and fourth electrodes) used for electric power supply/ground are also arranged. In each electrode 11, 12, 13, usually, the solder bump 35 used for flip-chip connection is previously formed.

First, the solder bumps used for electric power supply/ground, which are formed in the central region of the electrode forming face of the semiconductor element 10, are removed. Of course, unless the solder bumps are previously made in the central region 15 of the semiconductor element 10, no problems are caused. However, in this embodiment, explanations are made in a case in which the solder bumps are previously formed. After the solder bumps in the central region 15 of the semiconductor element 15 have been removed, when the semiconductor element 10 is mounted on the wiring board (or the package or the mother board) 20, a small gap is provided between the central region 15 of the semiconductor element 10 and the package 20. Of course, in the outer peripheral region 14 of the semiconductor element 10, the ball-shaped solder bumps 35 are left formed on the electrodes 11.

Next, the thin additional functional element, for example, the chip-shaped capacitor 30 is mounted on the electric power supply/ground electrodes 12, 13 to be connected to them. Concerning the method of connection, it is possible to adopt a method of ultrasonic connection, anisotropic conductive adhesive film (ACF) connection, anisotropic conductive adhesive paste (ACP) connection or soldering connection.

This extremely thin type capacitor 30 can be manufactured, for example, by utilizing the surface polishing technique of polishing a silicon substrate surface. The extremely thin type capacitor 30 may be made of not only silicon but also organic material such as film or inorganic material such as ceramic. Concerning the additional functional element 30, not only the capacitor but also the passive element such as a resistor or inductance may be used. Not only the passive element but also the active element may be used as an additional functional element. As long as the element satisfies the following conditions, any element may be used. The conditions are: the element is so thin that it can be accommodated in a range of the height of the solder bumps 35; the element has electrodes on the upper and the lower faces; the element can be connected between the electrode of the semiconductor element and the connection pads on the package side; and a specific electric function can be generated by the element.

A plurality of through-holes are formed in this capacitor 30 in such a manner that the through-holes penetrate the capacitor 30 in the vertical direction from the upper face to the lower face. These through-holes are filled with conductive material such as copper, that is, the conductive vias 31 are formed in these through-holes. Both upper and lower sides of the capacitor 30 are electrically communicated to each other by these conductive vias 31. In other words, the semiconductor element 10 and the connection pads 22 of the package or the wiring board 20 are electrically connected to each other.

The electrode forming side of the semiconductor element 10, on which the extremely thin type capacitor 30 is mounted, is arranged being directed to the wiring board 20 side, and the solder bumps 35 are positioned to the connection pads 21 on the wiring board 20 and flip-chip connection is executed. Due to the foregoing, the electrodes 11 of the semiconductor element 10 and the connection pads 21 on the wiring board 20 are connected to each other by the solder bumps 35. At the same time, the face on the lower side of the capacitor 30 and the connection pads 23 on the wiring board 20 are connected to each other, and the lower end faces of the conductive vias 31 of the capacitor 30 are connected to the connection pads 22 on the wiring board 20.

A gap defined between the electrode forming face of the capacitor 30 and the wiring board 20 is usually filled with the under-fill 40. In this way, the semiconductor device of the present invention is completed. As an example, dimensions of the thus completed semiconductor device were as follows. Gap or height T between the electrode forming face and the wiring board 20 was approximately 80 μm, thickness or height t of the extremely thin type additional functional element (capacitor) 30 was approximately 40 μm, thickness of the portion connected by means of ultrasonic connection was approximately 10 μm, and thickness of the portion 33 connected by means of solder connection was approximately 30 μm.

The present invention can provide the following advantages. As explained above, according to the present invention, when the additional functional element such as a capacitor 30 or the like is arranged in the closest portion to the semiconductor element 10, the occurrence of delay can be effectively suppressed especially in the case of high speed operation. According to the present invention, not only the capacitor but also all additional functional elements 30 such as a resistor and inductance can be incorporated. Therefore, impedance matching can be accomplished, and the electric characteristic can be greatly improved. Further, the conventional parts such as a semiconductor element and package can be substantially used as they are. Furthermore, the conventional manufacturing method can be substantially used as it is. Therefore, an investment in new equipment is not necessary. As the capacitor is incorporated into the semiconductor device, a larger space can be used for the capacitor, that is, a larger capacity of the capacitor can be ensured.

It should be understood by those skilled in the art that the foregoing description relates to only a preferred embodiment of the disclosed invention, and that various changes and modifications may be made to the invention without departing from the sprit and scope thereof.

What is claimed is:

1. A semiconductor device having an additional functional element, comprising:
   a semiconductor element, on at least one face of which first, second, third and fourth electrodes are arranged, wherein:
      the first electrodes are a plurality of electrodes for signal use, arranged in an outer peripheral region on the one face of the semiconductor element, and
      the second, third and fourth electrodes are arranged in a central region on the one face of the semiconductor element and the third and fourth electrodes provide electric power and grounding, respectively;
   a wiring board, having first, second, third and fourth connection pads on a mounting face on which the semiconductor element is mounted;
   a connector electrically connecting the first electrode with the first connection pad so that a small gap is formed between the one face of the semiconductor element and the mounting face of the wiring board when the one face of the semiconductor element is facing the mounting face of the wiring board; and
   an extremely thin passive element having a specific additional function arranged in the gap formed between the central region of the semiconductor element and the wiring board, wherein:
      the extremely thin passive element is connected with the second electrode on the one face of the semiconductor element and also is connected with the second connection pad on the mounting face of the wiring board so that a specific electric function can be exhibited; and
   the third and fourth electrodes are electrically connected with the third and fourth connection pads on the wiring board, respectively, through a plurality of conductive vias penetrating from one face of the extremely thin passive element to the other face thereof.

2. A semiconductor device according to claim 1, wherein:
   the connector is a solder bump;
   one face of the extremely thin passive element is connected with the second electrode by an ultrasonic connection, anisotropic conductive adhesive film or anisotropic conductive adhesive paste; and
   another face of the extremely thin passive element is connected with the second connection pad by soldering.

3. A semiconductor device according to claim 1, wherein the extremely thin passive element is an extremely thin capacitor, resistor or inductor.

4. A semiconductor device having an additional functional element, comprising:
   a semiconductor element, on at least one face of which first, second, third and fourth electrodes are arranged, wherein:
      the first electrodes are a plurality of electrodes providing a signal, arranged in an outer peripheral region on the one face of the semiconductor element, and
      the second, third and fourth electrodes are arranged in a central region on the one face of the semiconductor element and the third and fourth electrodes provide electric power and grounding, respectively;
   a wiring board, having first, second, third and fourth connection pads on a mounting face on which the semiconductor element is mounted;
   a connector electrically connecting the first electrode with the first connection pad while maintaining a distance between the one face of the semiconductor element and the mounting face of the wiring board when the one face of the semiconductor element is facing the mounting face of the wiring board; and
   a passive element, thinner than the distance between the one face of the semiconductor element and the mounting face of the wiring board, having a specific additional function and arranged in the distance between the one face of the semiconductor element and the mounting face of the wiring board, wherein the passive element is connected with the second electrode on the one face of the semiconductor element and connected with the second connection pad on the mounting face of the wiring board so that a specific electric function can be exhibited; and
   the third and fourth electrodes are electrically connected with the third and fourth connection pads on the wiring board, respectively, through a plurality of conductive vias penetrating from one face of the passive element to the other face thereof.

* * * * *